United States Patent [19]
Lee et al.

[11] Patent Number: 5,544,771
[45] Date of Patent: Aug. 13, 1996

[54] METHOD FOR MANUFACTURING A COLLIMATOR

[75] Inventors: Jueng-gil Lee; Sun-hoo Park; Gil-heyun Choi, all of Kyungki, Rep. of Korea

[73] Assignee: Samsung Electronics Co., Ltd., Suwon, Rep. of Korea

[21] Appl. No.: 493,735

[22] Filed: Jun. 22, 1995

Related U.S. Application Data

[62] Division of Ser. No. 365,447, Dec. 28, 1994.

[30] Foreign Application Priority Data

Feb. 23, 1994 [KR] Rep. of Korea ............... 94-3231

[51] Int. Cl.$^6$ ................ C23F 1/00; B04C 1/22
[52] U.S. Cl. ................ 216/2; 216/33; 216/52; 216/56
[58] Field of Search ............... 216/2, 8, 52, 56, 216/33; 156/645.1, 655.1, 656.1; 204/290

[56] References Cited

U.S. PATENT DOCUMENTS

| | | | |
|---|---|---|---|
| 2,619,438 | 11/1952 | Varian et al. | 216/56 X |
| 3,247,579 | 4/1966 | Cattermole et al. | 216/52 X |
| 4,006,073 | 2/1977 | Welch. | |
| 4,065,046 | 12/1977 | Roberts et al. | 216/52 X |
| 5,080,774 | 1/1992 | Heitzer. | |
| 5,135,629 | 8/1992 | Sawada et al.. | |
| 5,223,108 | 6/1993 | Hurwitt. | |
| 5,294,320 | 3/1994 | Somekh et al.. | |

*Primary Examiner*—William Powell

[57] ABSTRACT

A method for manufacturing a collimator comprising the steps of patterning a plurality of thin metal strips into a plurality of basic plates, and forming grooves or ridges on front and back surfaces of each basic plates. Thereafter, the thin strips are folded, mated, and welded together to form pillar cells within the collimator.

8 Claims, 3 Drawing Sheets

METHOD FOR MANUFACTURING A COLLIMATOR

This is a division of application Ser. No. 08/365,447, filed Dec. 28, 1994.

BACKGROUND OF THE INVENTION

The present invention relates to a sputtering device used in the manufacture of a semiconductor devices. More particularly, the present invention relates to a collimator used in a sputtering device which provides uniform film growth, fewer density defects, and decreased contamination particles.

Multi-layer wiring is a principal factor for the increased speed, yield, and reliability of current semiconductor devices, and is regarded as perhaps the single most important process in the multiplicity of processes required to manufacture a semiconductor device. However, multi-layer wiring is not without its problems. For example, contact sizes have become extremely small, aspect ratios have increased, and junctions formed on semiconductor substrates have become much thinner, because of recent enhancements to integration techniques and continuing efforts to miniaturize semiconductor devices. Specifically, the contact hole size of the next generation (i.e., DRAMS beyond 64 Mb) semiconductor devices has fallen below 0.5 μm and the aspect ratio of such is now greater than three. Given these design parameters, contact holes must be planarly buried by a metal or insulating layer in order to achieve the desired yield, speed and reliability of the semiconductor device.

As a method for burying contact holes having high aspect ratio, a W (tungsten) plug process has been proposed. Specifically, the W-plug process requires a titanium (Ti) or titanium-nitride (TiN) layer formed by a sputtering method as an adhesion layer or barrier layer in a lower portion. However, Ti or TiN layers have poor step coverage when applied via a sputtering method. Thus, a W-plug cannot be completely buried in contact holes having high aspect ratio and small size. Accordingly, shorts and reliability problems occur in a W-plug type metal layer.

More recently, a sputtering method employing a collimator when forming a Ti or TiN layer has been proposed in order to solve the above problems. The collimator used for the sputtering is intended to improve the uniformity of the grown film by means of directing the sputtered Ti or TiN. See "Sputtering Process Integration: PVD and Metal Annealing," *Proceedings of the 2nd International Symposium on ISSP '93*, p127–133). The conventional collimator is explained with reference to FIG. 1 and FIG. 2. FIG. 1 is a perspective view of a single pillar cell of the conventional collimator. The term "pillar cell," as used herein, is intended to describe a hollow three-dimensional structure having outer, defining "side walls" and a corresponding open central area aligned along the intended flow direction of sputtered material. FIG. 2 is a view illustrating one side wall of the pillar cell shown in FIG. 1.

Referring to FIG. 1 and FIG. 2, each pillar within the conventional collimator is shaped as a hexagon. Sputtered Ti or TiN passes from an upper portion 1 through the pillar cell to a lower portion 2. Reference numerals 4 and 5 of FIG. 1 denote the vertical component of movement for the sputtered Ti or TiN. In the conventional collimator, Ti or TiN typically having a vertical movement component passes through each pillar cell making up the collimator, thereby reducing the degree to which the "passed" Ti or TiN is scattered. As a result, uniformity and step coverage of the Ti or TiN film is improved.

Unfortunately, while Ti or TiN having a vertical movement component passes easily through each pillar cell, Ti or TiN having a horizontal movement component does not pass through each pillar cell. Quite to the contrary, "grains" of Ti or TiN, shown as elements 3 in FIG. 1, having a horizontal movement component adheres to side walls of the pillar cell. Once adhered the grains of Ti or TiN collide with sputtered Ti or TiN in the successive vacuum deposition processes and generate unwanted heat on side walls of each cell.

The following table shows the thermal expansion coefficient and thermal conductivity with respect to each material used for the conventional collimator.

| material | linear thermal expansion coefficient | thermal conductivity |
|---|---|---|
| aluminum | $25.0 \times 10^6 /°C.$ | 2.37 watts/cm °C. |
| titanium | $8.5 \times 10^6 /°C.$ | 0.2 watts/cm °C. |
| tungsten | $4.5 \times 10^6 /°C.$ | 1.78 watts/cm °C. |
| silicon | $3.0 \times 10^6 /°C.$ | 0.835 watts/cm °C. |
| stainless steel | 9.6 microns/inch °F. | 0.08 kcal/sec cm °C. |

As can be seen in the above table, thermal stress is generated by the difference between the heat transfer phase and heat expansion coefficient of the material used to construct the collimator and the sputtered material. This thermal stress ultimately causes adhering grains of Ti or TiN to "drop off" the side walls of the collimator in an uncontrolled fashion.

FIG. 2 shows a smooth side wall surface 6 of the conventional pillar cell shown in FIG. 1. Since side wall surface 6 of the conventional collimator is smooth and slippery, adhering grains of Ti or TiN drop off relatively easily. Grains "dropping off" during the deposition process create contamination particles on the surface of the semiconductor device undergoing fabrication.

Accordingly, semiconductor devices manufactured with the conventional collimator suffer from degraded yield and reliability problems due to the presence of process-induced contamination particles on the semiconductor substrate. Furthermore, such particles represent a notable hinderance to the stable operation of the sputtering device.

SUMMARY OF THE INVENTION

In view of the foregoing, it is an object of the present invention to provide a collimator which provides improved yield and reliability in manufactured semiconductor devices.

It is another object of the present invention to provide a collimator for a sputtering device which facilitates stable operation of a sputtering device.

It is yet another object of the present invention to provide a suitable method for manufacturing the collimator.

To accomplish the above objects, a collimator according to the present invention comprises a plurality of pillar cells; wherein each one of the plurality of pillar cells comprises, a plurality of planar side walls, at least one of said plurality of planar the walls having grooves and ridges formed on the surface of the at least one side wall.

Furthermore, to accomplish the above objects, a method of manufacturing a collimator according to the present invention comprises the steps of; patterning each one of a plurality of thin strips into a plurality of basic plates, forming grooves on front and back surfaces of each one of the plurality of basic plates, folding each one of the plurality of strips, mating an opposing pair of folded strips to form at least one pillar cell, and welding the mated pair of folded strips.

BRIEF DESCRIPTION OF THE DRAWINGS

The above objects and other advantages of the present invention will become more apparent upon consideration of a preferred embodiment thereof with reference to the attached drawings in which.

DETAILED DESCRIPTION OF THE INVENTION

Figure 1:
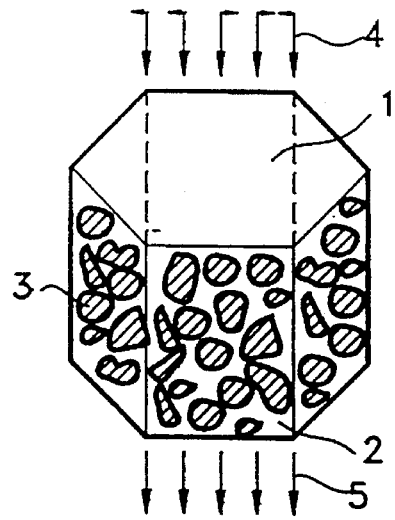
FIG. 1 is a perspective view of one pillar cell within the conventional collimator.
Figure 2:
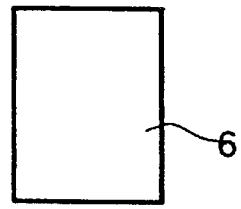
FIG. 2 is a view illustrating one side wall of the pillar cell shown in FIG. 1.
Figure 3:
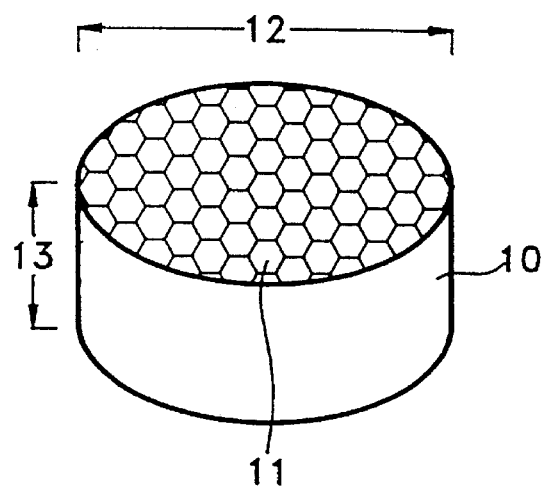
FIG. 3 is a perspective view of a collimator according to the present invention.

Referring to FIG. 3, a collimator 10 having a overall cylindrical structure is shown. Within this cylindrical structure, numerous pillar cells of hexagonal shape 11 are provided to form a bundle which fills the structure. The diameter 12 of collimator 10 is preferably 200–500 mm. The height 13 of collimator 10 is preferably 5–40 mm.

Figure 4:
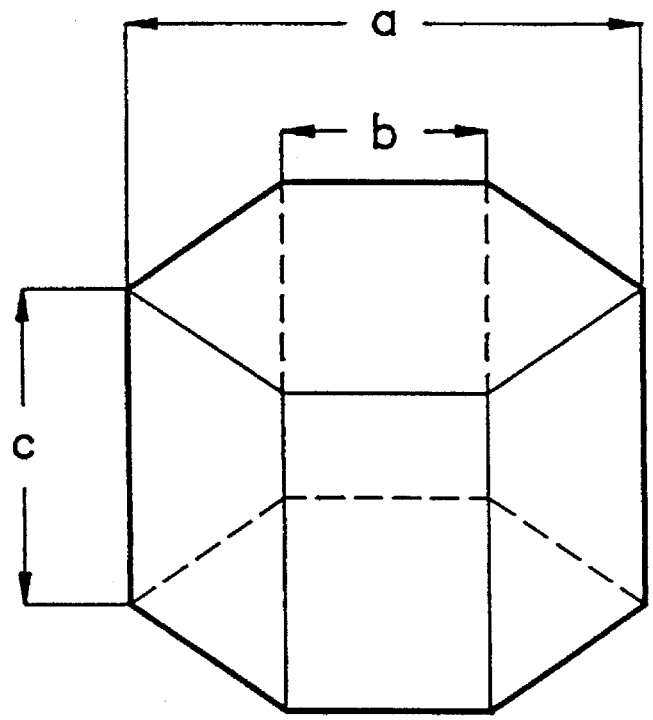
FIG. 4 is an enlarged view of a pillar cell with the collimator shown in FIG. 3.

FIG. 4 is an enlarged view of a single hexagonal-shaped pillar cell within collimator 10. Here, cell dimensions a, b and c are preferably 20–40 mm, 10–20 mm and 5–40 mm, respectively.

Figure 5:
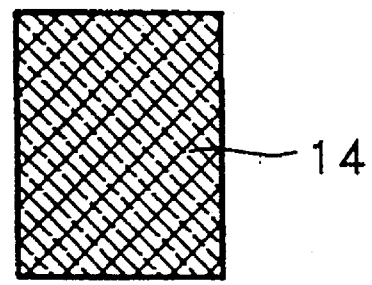
FIG. 5 illustrates one side wall of the pillar cell of the collimator shown in FIG. 3.

FIG. 5 illustrates one side wall of the pillar cell shown in FIG. 3. Referring to FIG. 5, a mesh of grooves and/or ridges 14 is formed over the entire surface of each side wall. The grooves and/or ridges are formed to create an uneven structure which provides an improved surface for Ti or TiN to adhere to on side wall of the pillar cell. The depth of grooves is preferably 0 to 10 µm.

Hereinafter, a method for manufacture adapted to produce an improved collimator according to the present invention will be explained with reference to FIGS. 6A through 6D.

Figure 6A:
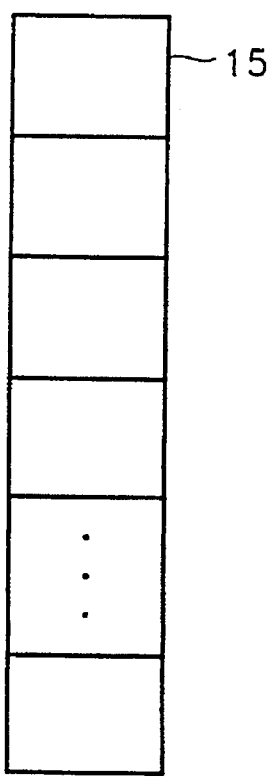
FIGS. 6A through 6D illustrate a set of steps in a method for manufacturing a collimator according to the present invention.

FIG. 6A illustrates the step of preparing basic plates 15 by patterning a thin strip of material into the rectangular shapes having a suitable ratio of length to width. Patterning may be accomplished by partial cutting of the thin strip, indenting the thin strip, or otherwise demarcating "fold points" along the thin strip which will yield acceptable basic plates. Basic plates 15 are regular in size as shown in FIG. 6A in order to construct a cell as described below. The thickness of the thin strip is preferably less than 1 mm. The width of the thin strip (and thus the basic plates 15, see element c in FIG. 4) is preferably 5 to 40 mm. The length of the basic plates 15 is preferable (n×b), where n is an integer, and b is the element shown in FIG. 4.

Figure 6B:
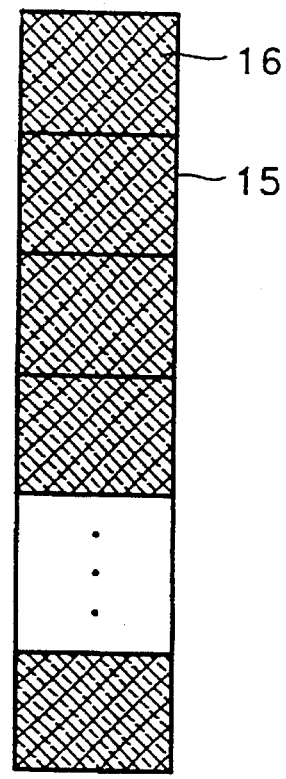

FIG. 6B illustrates the step of forming fine grooves and/or ridges on the surface of the front and back sides of basic plates 15. Referring to FIG. 6B, fine grooves and ridges 16 are formed as a mesh on the surface of basic plates 15. This is done to improve adhesion of the adhering Ti or TiN particles. The textured side walls also allow the resulting collimator to be more readily cleaned. As a result of the two foregoing advantages, contamination particles can be suppressed in the reactive container.

Figure 6C:
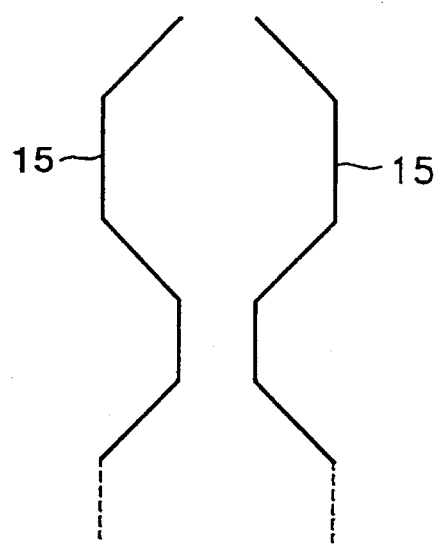

FIG. 6C illustrates the step of folding the patterned strips to form a portion of a series of pillar cells. Referring to FIG. 6C, a pair of opposing folded strips are mated basic plate 15 for basic plate 15 to form hexagonal-shaped pillar cells.

Figure 6D:
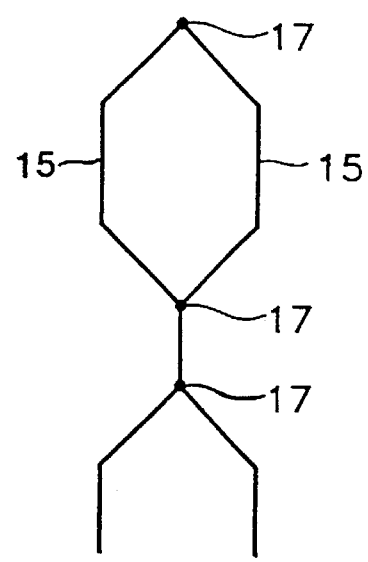

FIG. 6D illustrates the step of welding the mated pair of patterned strips to produce a final hexagonal shaped pillar structure. Referring to FIG. 6D, the folded strips are welded so that various cells are connected to each other. Reference numeral 17 denotes the points to be welded. Once welded the pillar cells are bundled and placed into the cylindrical structure of the collimator shown in FIG. 3.

Material used to construct the collimator and the metal strips forming the pillar cells may be aluminum, titanium, tungsten, silicon or stainless steel. Since the fine grooves and/or ridges are formed in the surface of the side walls of each cell in the collimator of the present invention, adhesion of horizontally moving particle during sputtering is improved. Generation of particles can thus be suppressed during the sputtering process to thereby achieve a more reliable semiconductor device and more stable operation of the sputtering device.

The preferred embodiment is given by way of example. Those of ordinary skill in the art will appreciate that variations and modifications may be made to the foregoing exemplary embodiment without removing such changes from the scope of the appended claims.

What is claimed is:

1. A method for manufacturing a collimator comprising the steps of:

patterning each one of a plurality of thin strips into a plurality of basic plates;

forming grooves on front and back surfaces of each one of the plurality of basic plates;

folding each one of the plurality of thin strips to form a portion of at least one pillar cell;

mating an opposing pair of folded thin strips to form at least one pillar cell; and, welding the mated pair of folded thin strips.

2. A method for manufacturing a collimator according to claim 1, further comprising the step of forming ridges on front and back surfaces of each one of the plurality of basic plates.

3. A method for manufacturing a collimator according to claim 1, wherein each one of the plurality of thin strips is patterned into a plurality of basic plates having a rectangular shape.

4. A method for manufacturing a collimator according to claim 3, wherein the mated opposing pair of folded strips form at least one hexagon-shaped pillar cell.

5. A method for manufacturing a collimator according to claim 1, wherein the plurality of thin strips are comprised of metal having a thickness less than 1 mm.

6. A method for manufacturing a collimator comprising the steps of:

patterning each one of a plurality of thin strips into a plurality of basic plates;

forming ridges on front and back surfaces of each one of the plurality of basic plates;

folding each one of the plurality of thin strips to form a portion of at least one pillar cell;

mating an opposing pair of folded thin strips to form at least one pillar cell; and, welding the mated pair of folded strips.

7. A method for manufacturing a collimator according to claim 1, wherein each one of the plurality of thin strips is formed from a metal selected from the group consisting of aluminum, titanium, tungsten, silicon, and stainless steel.

8. A method for manufacturing a collimator according to claim 6, wherein each one of the plurality of thin strips is formed from a metal selected from the group consisting of aluminum, titanium, tungsten, silicon, and stainless steel.

* * * * *